United States Patent [19]
Schreiber et al.

[11] Patent Number: 5,373,410
[45] Date of Patent: Dec. 13, 1994

[54] SINGLE STRING RESISTIVE DIVIDER NETWORK FOR A DIGITAL MULTIMETER

[75] Inventors: Paul T. Schreiber, Fort Worth, Tex.; Douglas R. Curtis, Los Gatos, Calif.

[73] Assignee: Tandy Corporation, Tex.

[21] Appl. No.: 859,142

[22] Filed: Mar. 27, 1992

[51] Int. Cl.⁵ .............................................. H02H 9/06
[52] U.S. Cl. ........................................ 361/56; 361/91; 361/119
[58] Field of Search ............... 361/56, 91, 111, 119; 324/73 AT, 73 B

[56] References Cited

U.S. PATENT DOCUMENTS

| | | | |
|---|---|---|---|
| 4,438,498 | 3/1984 | Sekel et al. | 364/483 |
| 4,441,063 | 7/1990 | McCartney et al. | 361/119 |
| 4,458,197 | 7/1984 | Robinson | 324/73 AT |
| 4,492,916 | 1/1985 | Johnson | 324/60 CD |
| 4,563,770 | 1/1986 | Lemelson et al. | 381/51 |
| 4,586,104 | 4/1986 | Standler | 361/91 |
| 4,608,532 | 8/1986 | Ibar et al. | 324/73 R |
| 4,736,327 | 4/1988 | Power | 364/481 |
| 4,794,383 | 12/1988 | Havel | 340/704 |
| 4,864,512 | 9/1989 | Coulson et al. | 364/481 |

Primary Examiner—Todd E. DeBoer
Attorney, Agent, or Firm—Cesari and McKenna

[57] ABSTRACT

A relatively large protection resistor is connected between the measurement in-out terminal and the internal circuitry of a digital multimeter. A clamping circuit at the input to the internal circuitry insures that any voltage applied to the input terminal will be dropped across the protection resistor, thereby avoiding an over-voltage condition which could damage the internal circuitry. A resistive divider network used to make measurements is connected between the protection resistor and the clamping circuit and is designed to take the protection resistor into account during measurements.

16 Claims, 6 Drawing Sheets

| FUNCTION | RANGE | ACTIVATED SWITCHES | RESISTORS |
|---|---|---|---|
| DC VOLTS | 400nV | 57 | 10 (R1) |
|  | 4.0V | 57, 52, 89 | 10 (R1) TO 1.111M (R4) |
|  | 40V | 57, 53, 59, 523, 524A | 10 (R1) TO 101.1K (R4‖R5) |
|  | 400V | 57, 54, 59, 523, 524B | 10 (R1) TO 10.01K (R4‖R6) |
|  | 1000V | 57, 55, 59 | 10 (R1) TO 1.001K (R7) |
| AC VOLTS | 400mV RMS | 57 | 1 (R2) |
|  | 4.0V RMS | 57, 53, 510 | 1 (R2) TO 111.1K (R5) |
|  | 40V RMS | 57, 54, 510 | 1 (R2) TO 10.1K (R6) |
|  | 400V RMS | 57, 55, 510 | 1 (R2) TO 1.001K (R7) |
|  | 750V RMS | 57, 56, 510 | 1 (R2) TO 100 (R8) |
| OHMS | 400Ω | 579, 56 | 100 (R8) |
|  | 4KΩ | 579, 55 | 1.001K (R7) |
|  | 40KΩ | 579, 54, 522, 523, 524B | 10K (R8‖R4‖R6) |
|  | 400KΩ | 579, 53, 522, 523, 524A | 100K (R3‖R4‖R5) |
|  | 4MΩ | 579, 52, 51 | 1 (R3‖R4) |
|  | 40MΩ | 579, 51, | 10 (R3) |
| DC CURRENT | 4.0μA | 579, 566, 53, 57, 522, 523, 524A | 100K (R3‖R4‖R5) |
|  | 40μA | 579, 566, 54, 57, 522, 523, 524B | 10K (R3‖R4‖R6) |
|  | 400μA | 579, 566, 55, 57 | 1.001K (R7) |
|  | 4μA | 579, 566, 57 |  |
|  | 40μA | 579, 566, 57 |  |
|  | 400μA | 579, 566, 57 |  |
| AC CURRENT | 4.0μA | 579, 566, 53, 57, 522, 523, 24A | 1 (R3‖R4) |
|  | 40μA | 579, 566, 54, 57, 522, 523, 524B | 10K (R3‖R4‖R6) |
|  | 400μA | 579, 566, 55, 57 | 1.001K (R7) |
|  | 4μA | 579, 566, 57 |  |
|  | 40μA | 579, 566, 57 |  |
|  | 400μA | 579, 566, 57 |  |

Fig. 5

SINGLE STRING RESISTIVE DIVIDER NETWORK FOR A DIGITAL MULTIMETER

FIELD OF THE INVENTION

The present invention relates to digital multimeters and, more specifically, to a resistive divider network for use with such digital multimeters.

BACKGROUND OF THE INVENTION

Digital multimeters are multi-range test instruments capable of measuring voltage, current, resistance, and other parameters. A digital multimeter operates by converting the parameter to be measured into an analog voltage within a predetermined voltage range. This analog voltage is then converted to a digital number or word by means of an analog-to-digital converter. The digital word is then displayed on a digital display.

More particularly, an input voltage, or a voltage generated from an input current or an unknown resistor, is converted into an analog voltage within the input range of the analog-to-digital converter by applying the voltage to a resistive divider network. Generally, a separate resistive divider network or string is used for voltage, current and resistance measurements. Each resistive divider has multiple output taps and the divider is constructed in a known manner so that the input voltage is reduced at each tap by a predetermined ratio. Depending on the function (type of measurement) and range (of such measurement), one divider string is selected and an appropriate output tap is chosen to divide the input voltage down so that it lies within the input range of the analog-to-digital converter.

Many prior art digital multimeters utilize mechanical rotary switches for selecting the function and range for the measurement. These mechanical rotary switches have electromechanical contacts which connect one of the resistive divider strings to the appropriate input to make a measurement and connect the input of the analog-to-digital converter to one of the output taps from the resistive divider networks in order to select the appropriate measurement range. Such mechanical rotary switches are typically complicated and expensive to manufacture and somewhat awkward to operate. In addition, the mechanical contacts are subject to corrosion and dirt, either of which can render the meter inoperative.

Further, a mechanical rotary switch must often be turned "through" a measurement range to get to the desired range. For example, it may be necessary to turn the switch through the resistance measurement ranges to position the switch for a voltage measurement. During this process, the analog-to-digital converter can be damaged if the meter is left connected to the test input during the switching operation. Damage can also occur if a user selects an incorrect function and/or range.

This damage occurs because of the potentially harsh operating environment in which such meters are typically used. This operating environment may include measurement of voltages of a thousand volts or more and currents up to several amperes. In this operating environment, if a low voltage range is selected and a high voltage is actually applied to the meter, the resistive divider will not divide the voltage down sufficiently to place the reduced voltage within the operating range of the analog-to-digital converter and the over-voltage condition may be sufficient to damage the converter. This condition is exacerbated in most conventional meter designs because, in order to increase sensitivity at low measurement ranges, there is generally at least one meter setting in which the converter input is connected directly to the test input terminals. Such a connection renders the converter extremely vulnerable to over-voltage conditions.

In addition, conventional meter designs are generally not suitable for direct use with typical integrated circuits. Most integrated circuits operate with relatively low voltages on the order of a few volts. Since the meter must be able to operate with voltages on the order of a thousand volts, mechanical switch contacts, relay contacts or high-voltage semiconductor switches must be used to isolate the meter from the applied voltages. Electromechanical contacts have the disadvantages listed above and high-voltage semiconductor switches are expensive.

Another problem encountered with prior art digital multimeter circuits is that a single input terminal is used for both AC and DC voltage measurements. In order to avoid electrically loading a circuit which is being measured, the DC voltage measurement circuit is designed so that it has a high input impedance at the measurement input terminal. During an AC measurement, the high input impedance combines with stray capacitances at the meter input to cause rolloff of the AC voltage. As a result, prior art digital multimeters typically have poor high frequency AC sensitivity. A conventional prior art approach to solving this problem is to apply small trim capacitors across the resistors in the resistive divider network. These trim capacitors change the division ratio at high frequencies to compensate for the rolloff caused by the input impedance. Aside from increasing the manufacturing cost, these resistors create the need to use more complicated external switching, further increasing the overall meter cost.

Accordingly, a general object of the present invention is to provide a resistive divider network for a digital multimeter circuit which network uses a single divider string for all measurements, including voltage, current and resistance.

Another object of the present invention is to provide a resistive divider network in which the required function and range switching can be easily performed by low voltage, high performance, integrated circuit switches, thereby rendering the network amenable to complete integration.

Yet another object of the present invention is to provide a resistive divider network which includes high voltage input protection and thus allows the test inputs to be connected directly to the low voltage integrated circuit chip without costly high-voltage isolation switches.

A further object of the present invention is to provide a digital multimeter which separates the AC and DC voltage measurement paths at the input terminal, thereby eliminating the prior art rolloff problem.

Still a further object of the present invention is to provide a digital multimeter which can be microprocessor controlled.

SUMMARY OF THE INVENTION

The aforementioned problems associated with the prior art are overcome by the present invention and the aforementioned objects are achieved in one illustrative embodiment of the invention in which a relatively large protection resistor is connected between the measurement in-out terminal and the remainder of the divider circuit. A clamping circuit at the divider insures that any voltage applied to the input terminal will be dropped across the protection resistor, thereby avoiding an over-voltage condition.

A resistive divider network connected between the protection resistor and the clamping circuit is designed to take the protection resistor into account during measurements. The divider network can be reconfigured in both series and parallel configurations to perform all measurements with the same resistor string. In addition, the AC and DC voltage measurement paths are separated immediately after the input terminal and the AC voltage path is configured to use a lower input impedance in order to reduce rolloff at high frequencies.

Other advantages, novel features and objects of the invention will become apparent from the following detailed description of the invention when considered in conjunction with the accompanying drawings.

DETAILED DESCRIPTION OF THE PREFERRED EMBODIMENTS

Figure 1:
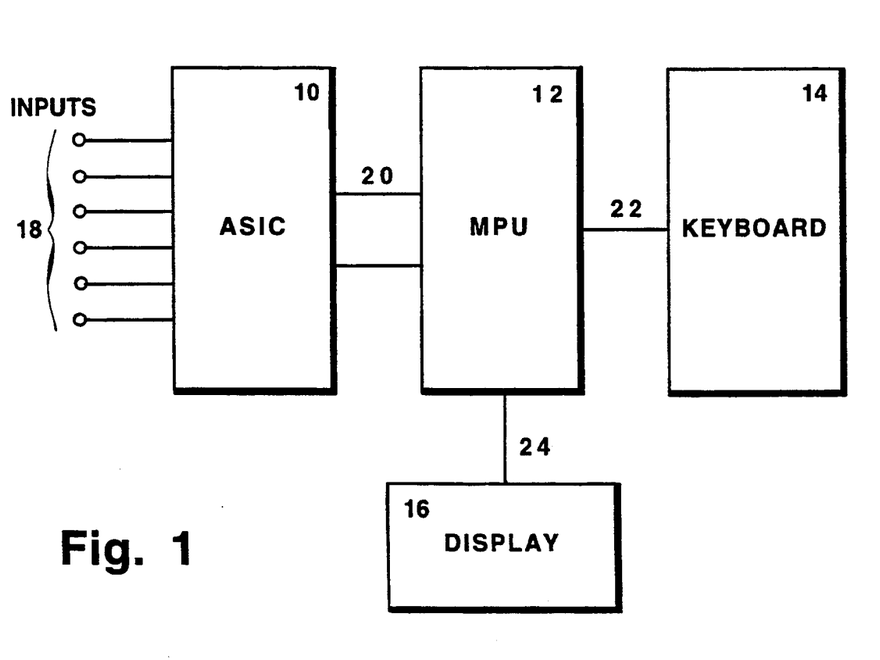
FIG. 1 is a block schematic diagram of the components of an illustrative digital multimeter which utilizes the resistive divider network of the present invention.

Referring to FIG. 1, a block diagram of the components of a digital multimeter utilizing the resistive divider network of the present invention are shown. As shown, the digital multimeter includes an application specific integrated circuit (ASIC) 10, a microprocessor (MPU) 12, an associated keyboard 14 and a display 16. Also illustrated are inputs 18 through which a user connects the quantities to be measured (i.e., a current, voltage or unknown resistor).

ASIC 10 includes the illustrative voltage divider circuitry of the invention. As previously mentioned, the inventive divider circuit is specifically designed to be used with relatively low-voltage switches and, thus, ASIC 10 is advantageously an integrated circuit. In accordance with the invention and as described below, inputs 18 can be directly connected to ASIC 10 even though it is an integrated circuit without the possibility of an over-voltage condition damaging ASIC 10. It is also possible to use a conventional rotary switch or relays to perform the switching functions in the inventive network, although the advantages of integration would be lost in this case.

Microprocessor 12 provides overall control of ASIC 10 which actually performs the voltage division and measurement functions. A measurement decision is made by the meter user and entered into the meter by means of keyboard 14. Keyboard 14, in turn, communicates with microprocessor 12 through line 22. Microprocessor 12 communicates with ASIC 10 through a plurality of bidirectional bus lines 20 and transmits information to the ASIC indicating the type of measurement to be performed and the desired range of that measurement.

The selected measurement is then performed by ASIC 10 and results in a digital word which represents the result of the measurement. This latter digital word is sent back to microprocessor 12 via communication lines 20 and microprocessor 12 thereupon outputs this result to display 16 for displaying the measured result with the proper range indication. Microprocessor 12 communicates with display 16 through line 24.

Figure 2:
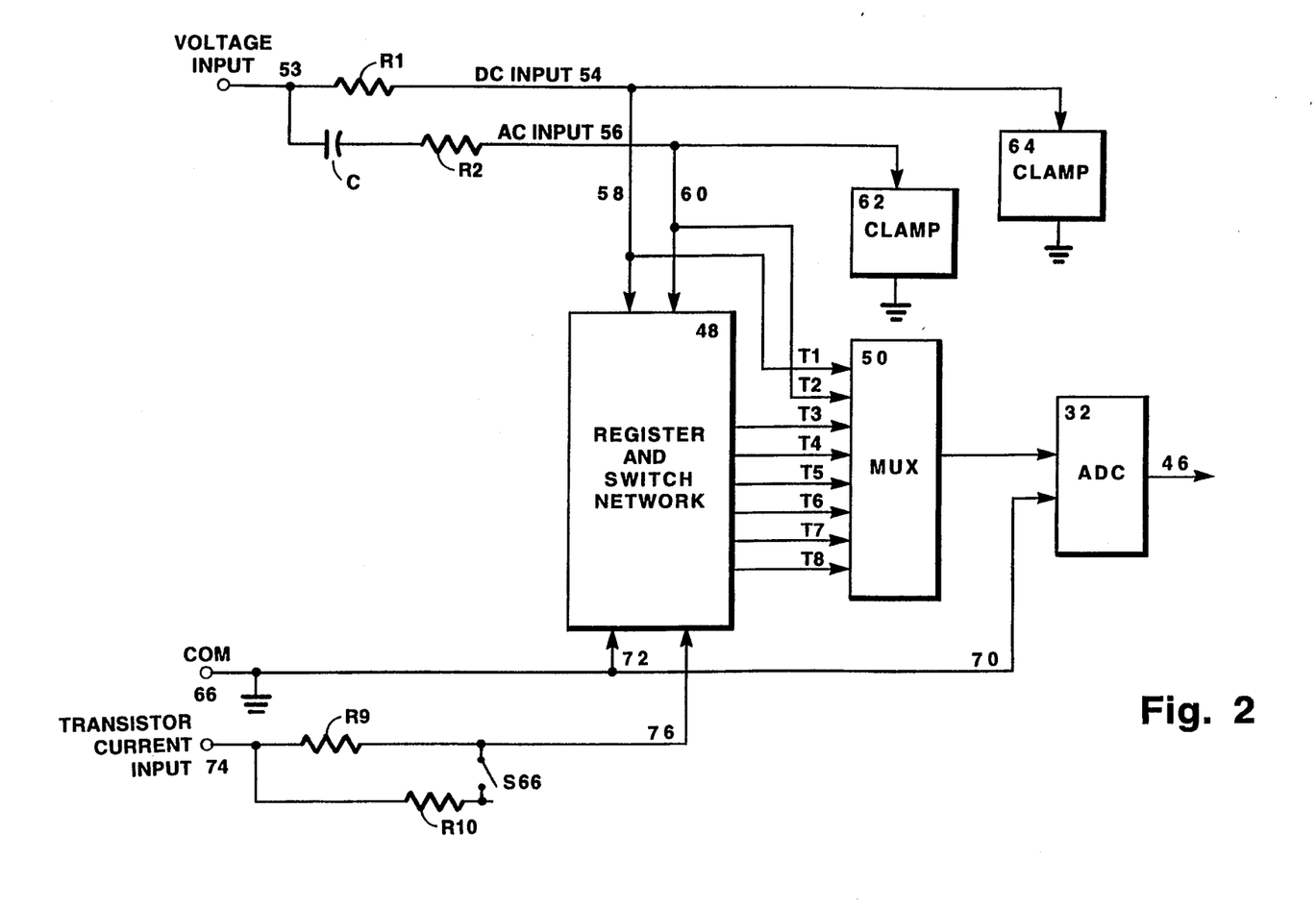
FIG. 2 is a more detailed block schematic diagram illustrating some of the internal components of, and inputs to, an application specific integrated circuit (ASIC) shown in FIG. 1 which implements the resistive divider network of the present invention.

FIG. 2 illustrates selected inputs to, and some internal components of, ASIC 10 of FIG. 1, which provide measurement capability and implement the inventive resistive divider network. As illustrated in FIG. 2, ASIC 10 includes three inputs: a voltage input 52, a common input 66 (labeled "COM") which is grounded, and a combined resistance and current input 74. Other inputs may be provided for additional measurements such as capacitance and conductivity. Each of inputs 52, 66 and 74 are connected to the resistor and switch network 48 which will be described in detail hereinafter. One or more of the inputs are placed into contact with a device under test whose parameters are to be measured.

Voltage input 52 is utilized for testing both AC and DC voltage levels. In such a measurement, a voltage of unknown magnitude would be applied between voltage input 52 and common input 66. For measuring an unknown resistance value, the resistance would be connected between resistance and current input 74 and common input 66. For measuring an unknown current, the current would be injected into resistance and current input 74 and return through COM input 66. The configurations assumed by resistor and switch network 48 during each of the three aforementioned measurement functions will be described in further detail hereinafter.

During testing, a voltage is either applied to the resistor and switch network 48 or generated from resistance and current inputs as will be described. Network 48 includes a plurality of precision resistors which can be configured into a plurality of networks which, in turn, can be used to divide the applied voltage down into the input range of analog-to-digital converter 32. Output taps T1-T9, correspond to different division ratios and are provided to multiplexor 50 (labeled "MUX") which is a conventional selection circuit. Multiplexor 50, under control of microprocessor 12, can select one of the output taps T1-T9 and output the voltage thereon, via line 68, to analog-to-digital converter 32 (labeled "ADC"). Analog-to-digital converter 32 is also a conventional circuit which translates the divided voltage to a digital word which is sent to the microprocessor and displayed by the display as previously described.

In accordance with one aspect of the invention, the voltage measurement terminal 52 is not directly connected to the remainder of the circuitry. Instead, for DC voltage measurements, a relatively large valued resistor R1 is connected in series with input 52 and, for AC voltage measurements a capacitor C and a resistor R2 are connected in series. Similarly, for the resistance and current measurement terminal a large-valued resistor R9 is included. The presence of these elements prevents an over-voltage situation from damaging the remainder of the circuitry. For current measurement situations, as will be discussed below, resistor R9 can be shunted by a low-valued resistor R10 (by means of switch 66) to provide a low impedance current path. In this latter case a clamp circuit (not shown in FIG. 2) can be used to protect the input from over-voltage situations.

More particularly, resistor R1 is connected to DC input line 54 which, in turn, is connected to resistor and switch network 48 through line 58. Capacitor C and resistor R2 are connected To AC input line 56 which is, in turn, connected to resistor and switch network 48 through line 60.

DC input line 54 and AC input line 56 are also each connected to clamping circuits 64 and 62, respectively which provide for high input voltage protection. Clamping circuits 62 and 64 (which, preferably are located off of ASIC 10) operate to connect AC input line 56 and DC input line 54, to ground, when the voltage level on the respective line reaches a predetermined maximum clamping level. This voltage level is generally set to a voltage slightly below the circuit power supply voltage so that no damage will occur to the network 48 or the multiplexer 50 under any conditions. When the voltage level on input line 54 or 56 reaches, or exceeds, the clamping level, clamping circuits 62 and 64 go into a low-impedance state, effectively limiting the maximum voltage on lines 54 and 56 to the predetermined value. Clamping devices such as devices 62 and 64 may illustratively include diodes and Zener diodes and transistors connected in a conventional configuration.

Consequently, even if microprocessor 12 (FIG. 1) is programmed for an incorrect range, such as a low voltage range, and a high voltage is applied to voltage input 52, the low voltage components within the resistor and switch network, such as the low voltage switches, as well as the low voltage components in the output circuitry, are protected from damage due to the action of clamping circuits 62 and 64 which limit the voltage on leads 54 and 56 to a safe value and cause most of the applied voltage to drop across resistors R1 and R2.

In accordance with another aspect of the present invention, DC input line 54 and separate AC input line 56 are both connected to voltage measurement input 52 at node 53. The values of resistances R1 and R2 are selected so that R2 is much smaller than R1. For example, in a preferred embodiment of the present invention, R1 has a value of 10 megohms while R2 has a value of 1 megohms. Therefore, because there exist separate AC and DC input lines and the AC input impedance is much lower than the DC input impedance, good high frequency AC performance results without the need for trimming capacitors in network 48. The configuration of network 48 which allows for measurements to be made with separate inputs is described in detail below.

Figure 3:
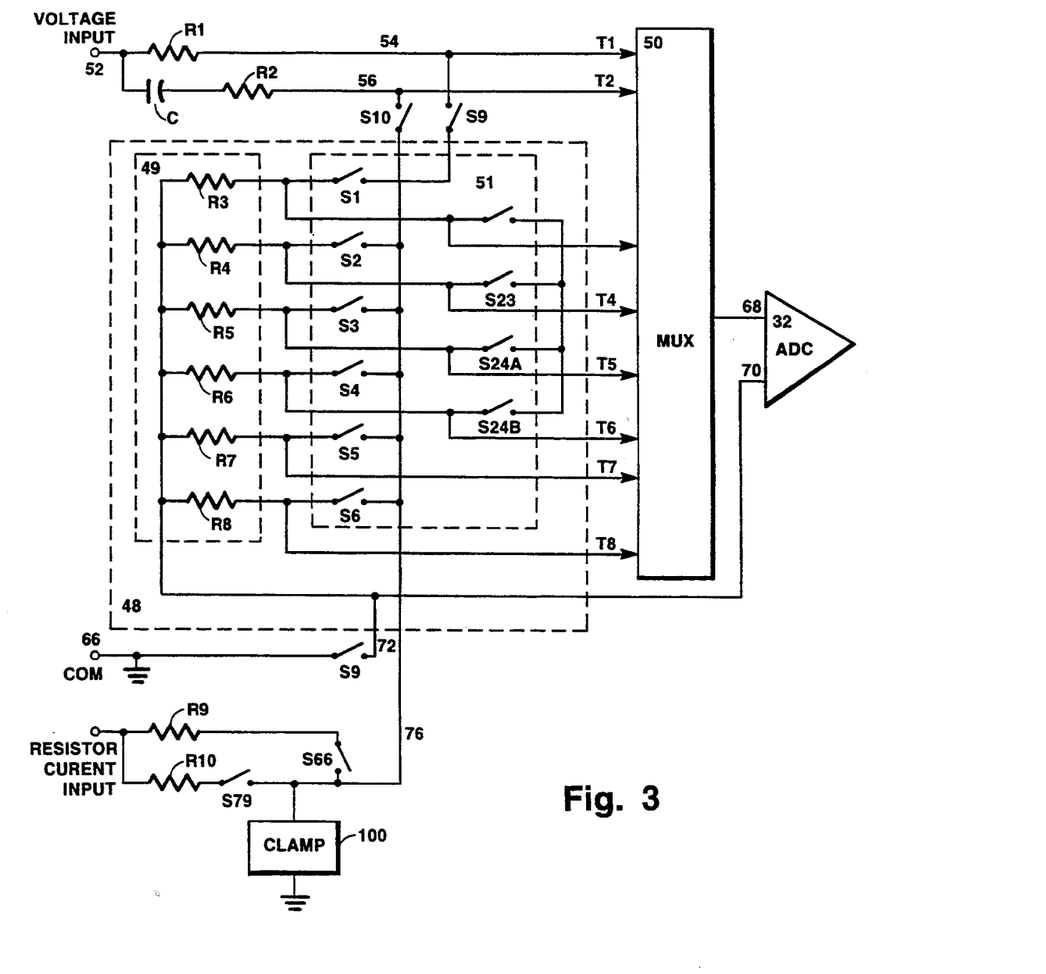
FIG. 3 is a partial block schematic diagram of an illustrative reconfigurable resistive divider network and associated switches according to the present invention.

Referring now to FIG. 3, details of the resistor and switch network 48 are illustrated. As illustrated, each of the measurement inputs, including the voltage input 52, the common input 66, and the resistance and current input 74 are connected to the resistive divider string 49 and switch network 51 through sets of isolation switches labeled S7, S9, S10, and S79. More particularly, DC voltage line 54 and AC voltage line 56 are connected to resistor and switch network 48 through switches S9 and S10, respectively. Common input 66 is connected to resistor and switch network 48 through switch S7. Resistance and current input 74 is connected to resistor and switch network 48 through switches S79 and S66. Therefore, each of the inputs can be independently disconnected from the resistor string 49 and switch network 51 by means of operation of the appropriate switches. This independent isolation operation allows for rapid, sequential testing of voltages, currents and resistances. For example, an unknown resistor may be connected between resistance and current input 74 and common input 66 at the same time that a voltage is applied across voltage input 52 and common input 66, and each of these elements may be measured sequentially, simply by alternately closing the appropriate isolation switches in a manner to be explained below. As aforementioned, the switches can be controlled by a microprocessor which receives the desired measurement function as an input from the user. Additional switches are provided (not shown in FIG. 2) which are used to reconfigure the ASIC in the current and resistance measurement modes. The configuration in each of these modes is discussed further below.

As illustrated, resistor and switch network 48 (included within the rectangular dotted line) includes resistive divider string 49 (shown surrounded by the smaller rectangular dotted line) and multiple switch network 51 (shown surrounded by the larger rectangular dotted line). Resistive divider network 49 includes precision resistors R3, R4, R5, R6, R7 and R8 which are typically metal-film resistors. Due to the precision required, these resistors are generally not part of the ASIC circuit 10 (FIG. 1). Multiple switch network 51 includes switches S1, S2, S3, S4, S5, S6, S22, S23, S24A and S24B which may be preferably implemented as low-voltage semiconductor switches in ASIC 10.

Resistor and switch network 48 additionally includes taps T3–T8 which are connected to the inputs of multiplexor 50. Taps T1 and T2 are connected directly to DC input line 54 and AC input line 56, respectively whereas the remaining taps are connected to the switch network 51 and provide the capability of selecting different division ratios. Multiplexor 50 is controlled in a known manner to select one input from taps T1–T9 and apply the signal thereon to output 68.

The output 68 of multiplexor 50 is inputted to analog-to-digital converter 32. The other input 70 to analog-to-digital converter 32 originates from common input 66.

Preferred resistor values for the resistive divider network 49 include the following: R3=10M ohms, R4=1.111M ohms, R5=111.1K ohms, R6=10.1K ohms, R7=1.001K ohms, R8=100 ohms, R9=90.9 K ohms and R10=100 ohms. The resistive divider network 49 is selectively reconfigured by operation of the switches within the multiple switch network 51 to divide the input voltage by a ratio which is within a range appropriate for provision to analog-to-digital converter 32, for example 0–400 mV.

For example, when a voltage in the range of 0–400 mV is to be measured, the voltage is applied across voltage input 52 and common input 66 and only switch 7 would be closed. Therefore, the input voltage would be applied through 10M ohm resistor R1 and DC input line 54 to multiplexor 50 through tap T1. Tap T1 would be selected by multiplexor 50 and the corresponding voltage would be outputted to analog-to-digital converter on output 68. No voltage division would be carried out for this particular input. Multiplexor 50 is constructed with integrated circuitry, preferably CMOS transistors so that it has a high input impedance. Thus, the presence of a large (10M) resistor in series with it has no effect on the voltage input. Consequently, the input voltage of 0–400 millivolts would be outputted to the analog-to-digital converter, which voltage would be operating within its range.

For a DC voltage measurement input in the range of 0–4 volts, switches S2, S7 and S9 would be closed. Therefore, the DC voltage of 4 volts would be applied through 10M ohm resistor R1, along DC input line 54, through switch S9, through switch S2, across 1.111M ohm resistor R4, along line 72, through switch S7 and to ground, thereby placing resistors R1 and R4 in series. Tap T4 would be selected by multiplexor 50 and the voltage thereon outputted to analog-to-digital converter 32. The voltage division carried out by the configuration of the resistive divider network in this situation would yield about 400 millivolts at tap T4, or a 10 to 1 reduction in voltage. Thus, the analog-to-digital converter would receive a voltage in the range of 0–400 millivolts or within its operating range.

For an input of in the range of 0–40 volts, a voltage division of about 100 to 1 is required to generate the appropriate voltage for provision to the analog-to-digital converter. Similarly, for higher voltages, a greater voltage division ratio would be performed by reconfiguring the resistive divider network.

In an AC voltage measurement situation, the operation would be similar to that described above with respect to DC voltage measurement in that the AC voltage is divided down into a predetermined lower AC voltage range by the divider string 49 and switch network 51. The divided AC voltage is selected on one of taps T1–T9. In the AC measurement case, the output of multiplexor 50 is provided to an AC to DC converter (not shown) instead of directly to converter 32. The AC to DC converter is a conventional circuit which converts the RMS value of the divided AC voltage into a DC value. This latter DC value is, in turn, provided to analog-to-digital converter 32 in order to produce the required digital output.

When measuring a current value or an unknown resistance, a DC voltage is generated as will hereinafter be described, and a similar voltage division operation is carried out by the resistive divider network, in order to output a voltage to the analog-to-digital converter within its operating range. The exact switch configurations for measuring current and unknown resistance will be described hereinafter.

Figure 4:
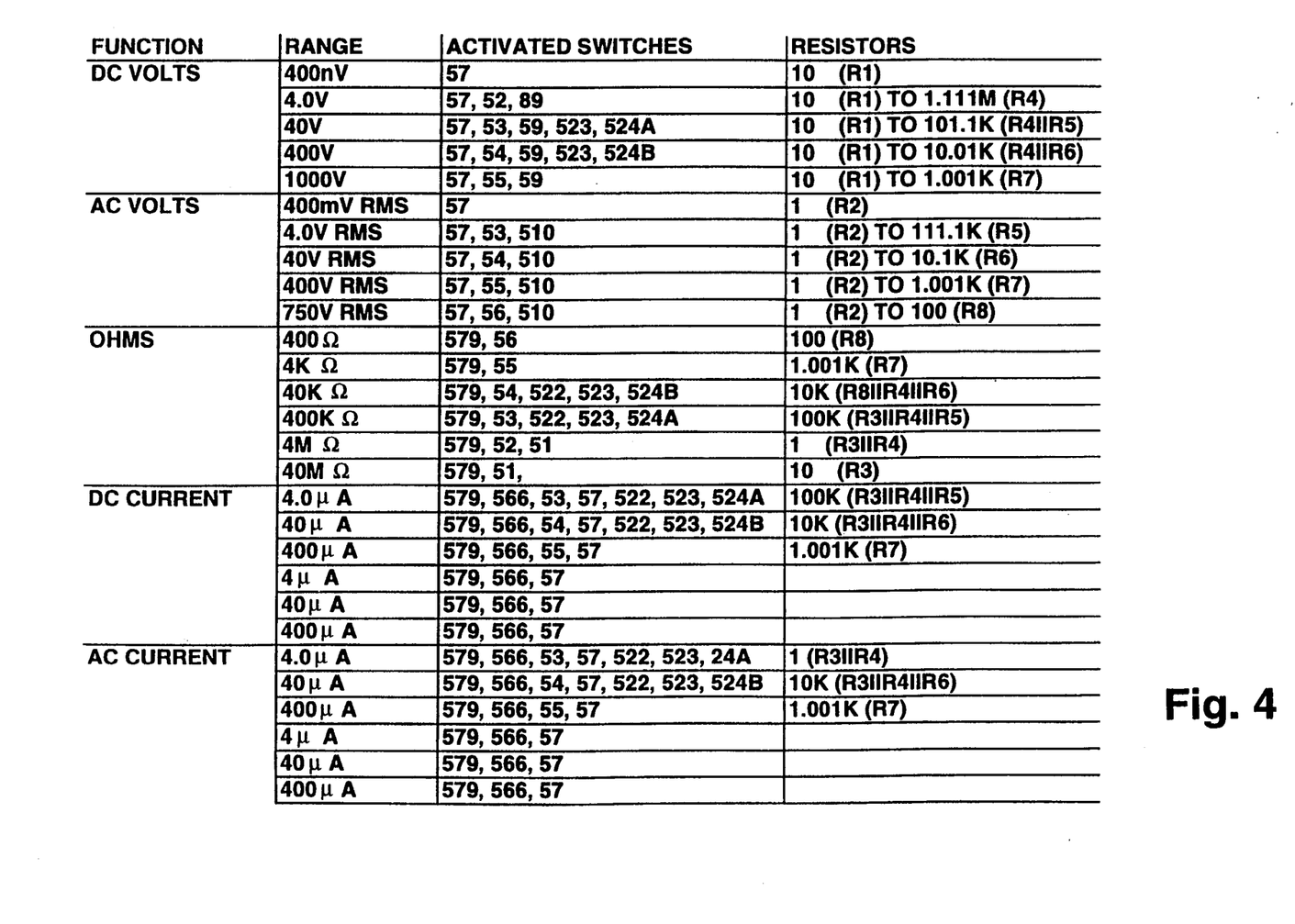
FIG. 4 is a graph listing the switches identified in FIG. 3 which are activated for testing a selected range of a selected function.

The resistors in the resistor string can be advantageously connected in series, in parallel or in series-parallel combinations to construct the precise resistance values necessary for each measurement. FIG. 4 is a graph listing the input range, the corresponding switches (identified in FIG. 3) that will be closed in the multiple switch network, and the resulting voltage ratio or division (with the particular resistors employed in the resistive divider network) performed, for each of the measuring functions including DC volts, AC volts, unknown resistance, DC current and AC current.

Figure 5:
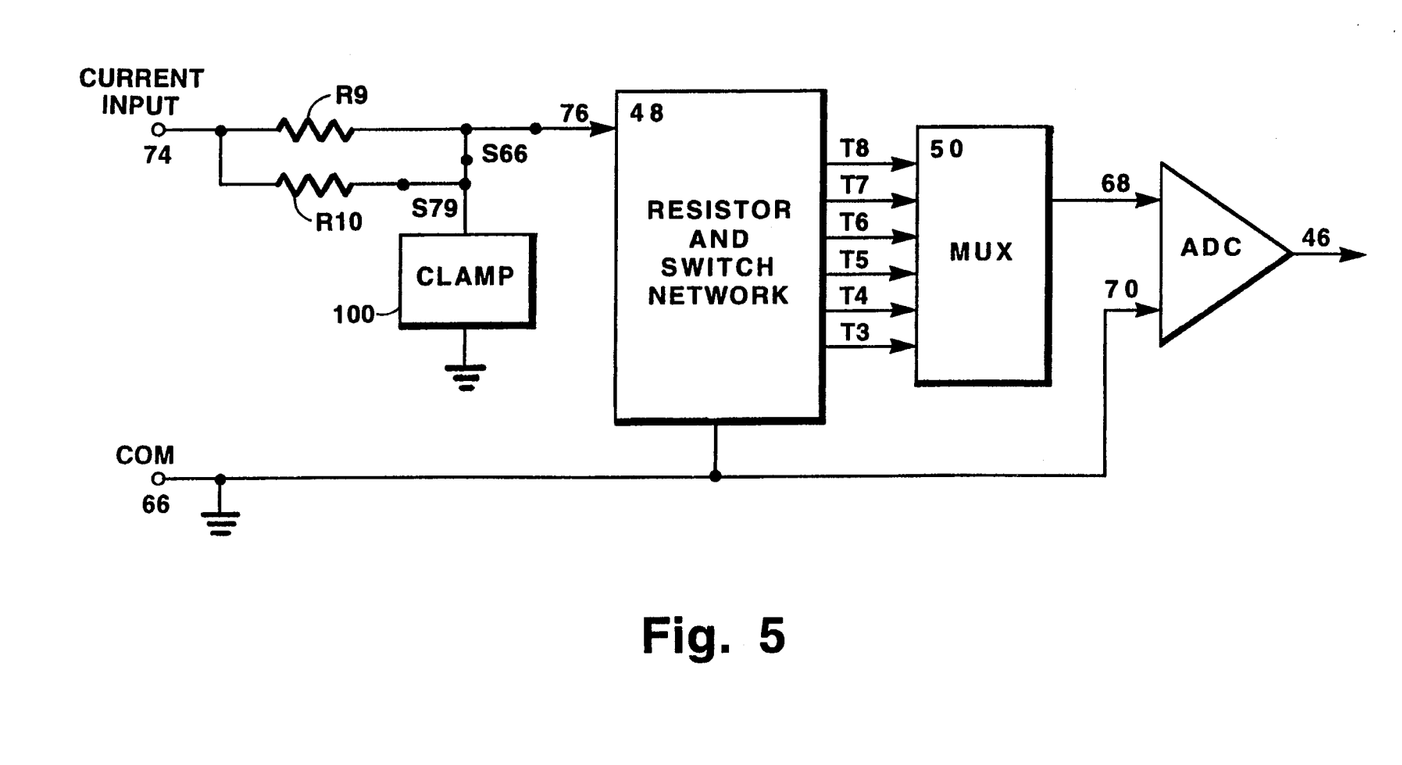
FIG. 5 is a block diagram of the inventive divider network, illustrating the configuration thereof during a current measurement, according to the present invention.

FIG. 5 illustrates the configuration of the ASIC during testing of AC or DC current. For these functions, switches S79 and S66 of FIG. 3 are closed, yielding the configuration illustrated in FIG. 5. As illustrated, the current is injected through current input 74 and runs through the resistor R9. Switch S66 is closed for current measurements so that resistor R10 is connected in parallel with resistor R9. Resistor R10 is a low-valued resistor which shunts the high value resistor R9 and provides a low impedance path for the current. In this case, a conventional clamping circuit 100 protects the integrated circuit by limiting the voltage on lead 76 to a safe value.

The current is provided from line 76 into resistor and switch network 48. One of the resistors in divider string 49 is selected by operation of the switch network 50 and placed in series with line 76 and ground. The resistor and switch network 48 is configured differently for each range of current, as listed in FIG. 4. In this manner, the voltage developed across the selected resistor in string 49 is within the proper input range of the converter.

Figure 6:
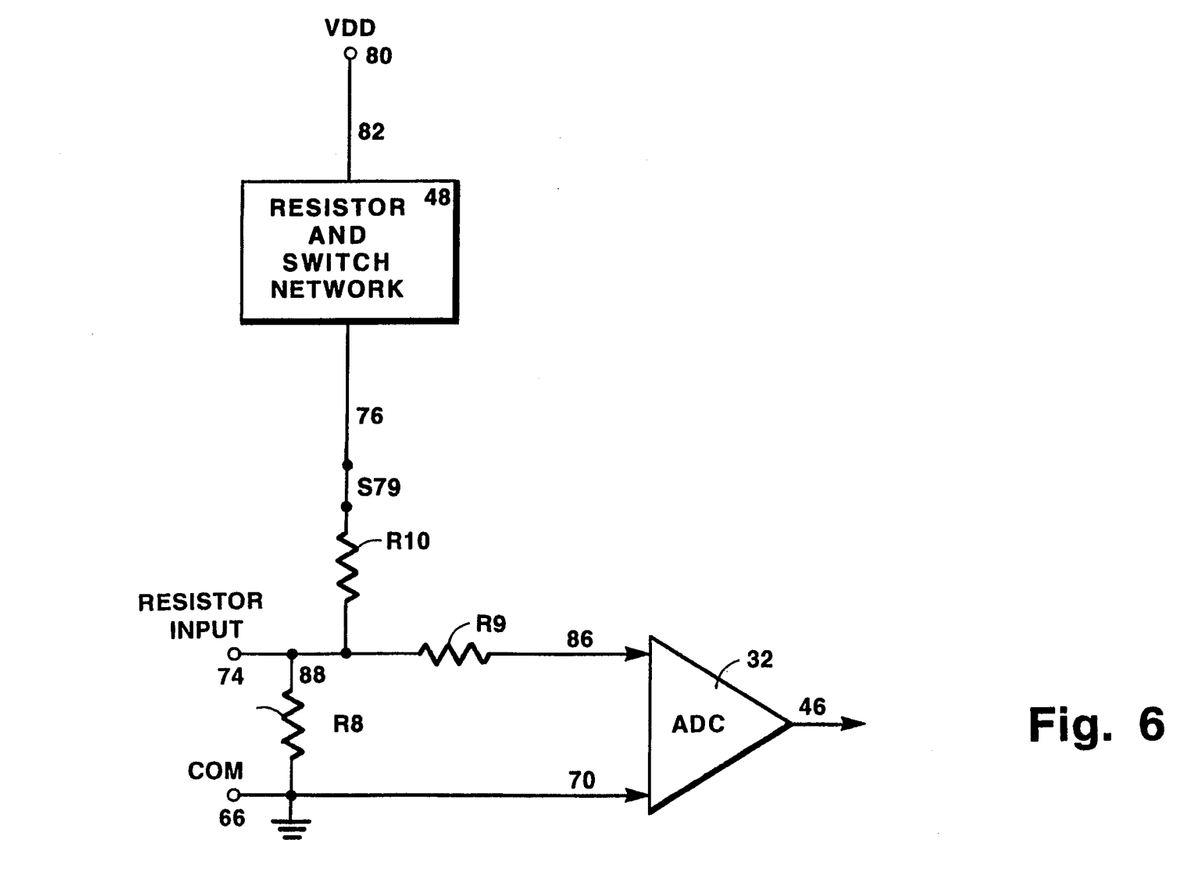
FIG. 6 is a block diagram of the inventive divider network, illustrating the configuration thereof during a resistance measurement, according to the present invention.

FIG. 6 illustrates the arrangement of the ASIC during measurement of a resistance value of an unknown resistor Rx. As illustrated in FIG. 6, unknown resistor Rx is connected across resistance input 74 and common input 66. To achieve the configuration illustrated in FIG. 6, for all ranges of unknown resistance testing, switch S79 of FIG. 3 is closed. As illustrated in FIG. 6, reference voltage VDD (which may illustratively be provided by a battery or other power source referenced to ground, not shown) at node 80 is applied, via line 82, to resistor and switch network 48. Network 48 forms a resistive voltage divider with resistor Rx by means of line 76 and resistor R10. Thus, a voltage division of the known voltage VDD is accomplished across known resistors in the resistor and switch network 48, and resistor R10 and the unknown resistance Rx. The resistor which is switched into the divider for each resistance range, is specified in the graph in FIG. 4 above. The voltage developed across the unknown resistor Rx at point 88 is applied via high value resistor R9 to the input 86 of the analog-to-digital converter 32.

After the analog voltage has been converted into a digital word and returned to the microprocessor, the value represented by the digital word, along with the knowledge of the particular range for the particular function with which the measurement was made enables the microprocessor to readily ascertain, and display, the final parameter value as will be apparent to one skilled in the art.

Having now described a limited number of embodiments of the invention, it should now be apparent to those skilled in the art that numerous other embodiments and modifications thereof are contemplated as falling within the scope of the present invention as defined by the appended claims.

What is claimed is:

1. A digital multimeter circuit for measuring voltages within a first operating range and a second operating range comprising:

a first voltage input terminal for receiving a voltage to be measured having a magnitude;

an analog to digital converter responsive to a voltage input within an input range for generating a digital output representative of the voltage input;

a first clamping circuit connected to the analog to digital converter for maintaining a voltage level applied to the analog to digital converter within the input range; and a first protection impedance connecting the first voltage input terminal to the analog to digital converter, the first protection impedance having a value sufficiently high that any voltage to be measured having a magnitude within the first operating range will be reduced in magnitude by the first protection impedance to a magnitude which falls within the input range.

2. A digital multimeter circuit according to claim 1 further comprising:
   a voltage divider network having an output and an input connected to the first protection impedance and responsive to the voltage to be measured for generating an output voltage on the voltage divider network output, the output voltage having a magnitude within the input range for any voltage to be measured having a magnitude within the second operating range; and
   a multiplexer connected to the voltage divider network output and to the first protection impedance and responsive to range selection commands for connecting the voltage divider network output and the first protection impedance to the analog to digital converter.

3. A digital multimeter circuit according to claim 1 wherein the first voltage input terminal receives DC input voltages and the digital multimeter circuit further comprises:
   a second voltage input terminal for receiving AC input voltages;
   a second clamping circuit connected to the analog to digital converter for maintaining a voltage level applied to the analog to digital converter within the input range; and
   a second protection impedance connecting the second voltage input terminal to the analog to digital converter, the second protection impedance having a value sufficiently high that any voltage to be measured having a magnitude within the first operating range will be reduced in magnitude by the second protection impedance to a magnitude which falls within the input range.

4. A digital multimeter circuit according to claim 3 further comprising a DC voltage blocking circuit connected in series with the second voltage input terminal and the second protection impedance.

5. A digital multimeter circuit according to claim 4 wherein the DC voltage blocking circuit comprises a capacitor.

6. A digital multimeter circuit according to claim 5 wherein the first voltage input terminal and the second voltage input terminal are connected to a common voltage input terminal which common voltage input terminal receives the voltage to be measured.

7. A digital multimeter for measuring voltages within a first operating range and a second operating range comprising:
   a common voltage input terminal which common voltage input terminal receives the voltage to be measured;
   a first voltage input terminal connected to the common voltage input terminal for receiving a DC voltage to be measured having a magnitude;
   a second voltage input terminal connected to the common voltage input terminal for receiving AC input voltages;
   an analog to digital converter responsive to a voltage input within an input range for generating a digital output representative of the voltage input;
   a first clamping circuit connected to the analog to digital converter for maintaining a voltage level applied to the analog to digital converter within the input range;
   a first protection impedance connecting the first voltage input terminal to the analog to digital converter, the first protection impedance having a value sufficiently high that any voltage to be measured having a magnitude within the first operating range will be reduced in magnitude by the first protection impedance to a magnitude which falls within the input range a second clamping circuit connected to the analog to digital converter for maintaining a voltage level applied to the analog to digital converter within the input range;
   a second protection impedance connecting the second voltage input terminal to the analog to digital converter, the second protection impedance having a value sufficiently high that any voltage to be measured having a magnitude within the first operating range will be reduced in magnitude by the second protection impedance to a magnitude which falls within the input range; and
   a multiplexer connected to the first protection impedance and to the second protection impedance and responsive to range selection commands for connecting the first protection impedance and the second protection impedance to the analog to digital converter.

8. A digital multimeter according to claim 7 further comprising:
   a voltage divider network having an output and an input connected to the first protection impedance and responsive to the voltage to be measured for generating an output voltage on the voltage divider network output, the output voltage having a magnitude within the input range for any voltage to be measured having a magnitude within the second operating range; and
   a circuit connecting the voltage divider network output to the multiplexer.

9. A digital multimeter according to claim 8 further comprising a DC voltage blocking circuit connected in series with the second voltage input terminal and the second protection impedance.

10. A digital multimeter according to claim 9 wherein the DC voltage blocking circuit comprises a capacitor.

11. A digital multimeter overvoltage protection circuit comprising:
   an input voltage terminal connected to an input voltage line;
   a first input impedance connected to the input voltage terminal through the input voltage line;
   an electrical circuit connected to the first input impedance;
   a clamping circuit connected between the first input impedance and ground, such that any voltage level on the input voltage terminal above a predetermined level is sunk across the first input impedance to ground, thereby protecting the electrical circuit.

12. The overvoltage protection circuit of claim 11, wherein said input voltage terminal is a terminal for measuring voltage and the electrical circuit is a voltage divider network, said overvoltage protection circuit further comprising:
   an additional input terminal connected to ground and to the voltage divider network, the voltage divider network being connected intermediate the clamping circuit and the first input impedance.

13. The overvoltage protection circuit of claim 12, wherein the input voltage terminal is a common voltage input terminal and the overvoltage protection circuit further comprise apparatus for connecting the common voltage input terminal to a DC voltage input line and apparatus for connecting the common voltage input terminal to an AC voltage input line through a capacitor.

14. The overvoltage protection circuit of claim 13 wherein the input impedance is connected in series with said DC voltage input line, and said overvoltage protection circuit further comprises:

a second input impedance connected in series with said AC voltage input line; and a second clamping circuit connected to said second input impedance such that said voltage divider network is connected to said AC voltage input line intermediate said second input impedance and said second clamping circuit.

15. The overvoltage protection circuit of claim 14 wherein the first input impedance has a value on the order of ten times the value of the second input impedance.

16. The overvoltage protection circuit of claim 11 wherein the input voltage terminal is a terminal for measuring current, and said overvoltage protection circuit further comprises:

an additional input terminal connected to ground and to the voltage divider network.

* * * * *